(12) United States Patent
Routh, Jr.

(10) Patent No.: US 9,275,828 B2
(45) Date of Patent: *Mar. 1, 2016

(54) SOURCE FOR SELECTIVELY PROVIDING POSITIVELY OR NEGATIVELY CHARGED PARTICLES FOR A FOCUSING COLUMN

(71) Applicant: FEI Company, Hillsboro, OR (US)

(72) Inventor: Brian Roberts Routh, Jr., Beaverton, OR (US)

(73) Assignee: FEI Company, Hillsboro, OR (US)

( * ) Notice: Subject to any disclaimer, the term of this patent is extended or adjusted under 35 U.S.C. 154(b) by 238 days.

This patent is subject to a terminal disclaimer.

(21) Appl. No.: 14/271,298

(22) Filed: May 6, 2014

(65) Prior Publication Data
US 2014/0326877 A1 Nov. 6, 2014

Related U.S. Application Data

(63) Continuation of application No. 13/306,032, filed on Nov. 29, 2011, now Pat. No. 8,716,673.

(51) Int. Cl.
| | |
|---|---|
| *H01J 49/04* | (2006.01) |
| *H01J 49/10* | (2006.01) |
| *H01J 37/20* | (2006.01) |
| *H01J 37/26* | (2006.01) |
| *H01J 27/16* | (2006.01) |
| *H01J 37/05* | (2006.01) |
| *H01J 37/077* | (2006.01) |

(Continued)

(52) U.S. Cl.
CPC .............. *H01J 37/265* (2013.01); *G01T 1/28* (2013.01); *H01J 27/16* (2013.01); *H01J 37/05* (2013.01); *H01J 37/077* (2013.01); *H01J 37/08* (2013.01); *H01J 37/30* (2013.01); *H01J 37/304* (2013.01); *H01J 37/3056* (2013.01); *H01J 2237/0817* (2013.01); *H01J 2237/24415* (2013.01); *H01J 2237/31749* (2013.01)

(58) Field of Classification Search
CPC ............ H01J 2237/31749; H01J 37/08; H01J 2237/0815; H01J 37/24; H01J 37/05
USPC ....... 250/423 R, 424, 306, 307, 396 R, 492.1, 250/492.3, 493.1; 315/111.81, 111.31
See application file for complete search history.

(56) References Cited

U.S. PATENT DOCUMENTS

| | | | |
|---|---|---|---|
| 5,188,705 | A | 2/1993 | Swanson et al. |
| 6,768,120 | B2 | 7/2004 | Leung et al. |

(Continued)

OTHER PUBLICATIONS

Coath, C. D., et al., 'A high-brightness duoplasmatron ion source for microprobe secondary-ion mass spectrometry,' Rev. Sci. Instrum., Feb. 1995, pp. 1018-1023, vol. 66, No. 2.

(Continued)

*Primary Examiner* — Bernard E Souw
(74) *Attorney, Agent, or Firm* — Scheinberg & Associates, PC; Michael O. Scheinberg; Nathan H. Calvert

(57) ABSTRACT

A single column charged particle source with user selectable configurations operates in ion-mode for FIB operations or electron mode for SEM operations. Equipped with an x-ray detector, energy dispersive x-ray spectroscopy analysis is possible. A user can selectively configure the source to prepare a sample in the ion-mode or FIB mode then essentially flip a switch selecting electron-mode or SEM mode and analyze the sample using EDS or other types of analysis.

20 Claims, 4 Drawing Sheets

(51) Int. Cl.
*H01J 37/08* (2006.01)
*H01J 37/304* (2006.01)
*H01J 37/305* (2006.01)
*G01T 1/28* (2006.01)
*H01J 37/30* (2006.01)

(56) References Cited

U.S. PATENT DOCUMENTS

| | | | |
|---|---|---|---|
| 7,049,585 B2 * | 5/2006 | Nakasuji et al. | 250/310 |
| 7,109,484 B2 * | 9/2006 | Nakasuji et al. | 250/310 |
| 7,241,361 B2 * | 7/2007 | Keller et al. | 156/345.48 |
| 7,670,455 B2 | 3/2010 | Keller et al. | |
| 7,829,871 B2 * | 11/2010 | Nakasuji et al. | 250/492.1 |
| 8,076,650 B2 | 12/2011 | Smith et al. | |
| 8,080,791 B2 | 12/2011 | von Harrach et al. | |
| 8,093,556 B2 | 1/2012 | Zeile | |
| 8,124,942 B2 | 2/2012 | Graupera et al. | |
| 8,253,118 B2 | 8/2012 | Zhang et al. | |
| 8,405,054 B2 | 3/2013 | Smith et al. | |
| 8,410,439 B2 | 4/2013 | von Harrach et al. | |
| 8,716,673 B2 * | 5/2014 | Routh, Jr. | 250/423 R |
| 2002/0036264 A1 * | 3/2002 | Nakasuji et al. | 250/306 |
| 2005/0092921 A1 * | 5/2005 | Nakasuji et al. | 250/306 |
| 2012/0032092 A1 | 2/2012 | Graupera et al. | |
| 2012/0091360 A1 | 4/2012 | Zhang et al. | |
| 2012/0280136 A1 | 11/2012 | Zhang et al. | |
| 2013/0015765 A1 | 1/2013 | Graupera et al. | |
| 2013/0098871 A1 * | 4/2013 | Miller et al. | 216/67 |

OTHER PUBLICATIONS

Kim, Yong-Ki, "Energy Distribution of Secondary Electrons," Radiation Research, 1975, pp. 21-35, vol. 61.

* cited by examiner

SOURCE FOR SELECTIVELY PROVIDING POSITIVELY OR NEGATIVELY CHARGED PARTICLES FOR A FOCUSING COLUMN

This application is a Continuation of U.S. application Ser. No. 13/306,032, filed on Nov. 29, 2011, which has been issued U.S. Pat. No. 8,716,673 B2 on May 6, 2014, the entire contents of which are incorporated by reference herein.

TECHNICAL FIELD OF THE INVENTION

The present invention relates to charged particle beam systems and, in particular, to the use of an inductively coupled plasma source to provide electrons or ions to process and analyze a sample.

BACKGROUND OF THE INVENTION

Focused charged particle beam systems, such as ion and electron beam systems, are used to image, analyze, and modify samples on a microscopic or nanoscopic scale. An electron beam, for example, can be used in a scanning electron microscope (SEM) to form images of a sample by the detection of secondary electrons and for elemental analysis by measuring an x-ray spectrum. A focused ion beam (FIB) system, for example, can be used in a variety of applications in nanotechnology and integrated circuit manufacturing to create and alter microscopic and nanoscopic structures. FIB systems can be used, for example, to image, mill, deposit, and analyze with great precision. Milling or micromachining involves the removal of bulk material at or near the surface of a sample. Milling can be performed without an etch-assisting gas, in a process called sputtering, or using an etch-assisting gas, in a process referred to as chemically-assisted ion beam etching. U.S. Pat. No. 5,188,705, which is assigned to the assignee of the present invention, describes a chemically-assisted ion beam etching process. In chemically-assisted ion beam etching, an etch-enhancing gas reacts in the presence of the ion beam to combine with the surface material to form volatile compounds. In FIB deposition, a precursor gas, such as an organometallic compound, decomposes in the presence of the ion beam to deposit material onto the target surface.

The charged particles can be produced from a variety of sources. A "bright" source is desirable because it can produce more charged particles into a smaller spot. The "brightness" of a charged particle beam source is related to the number of charged particles emitted per area and the solid angle into which the particles are emitted. The area from which the particles appear to be emitted is referred to as the "virtual source." High brightness sources typically have small virtual source sizes and can be focused onto smaller spots, which provides for higher resolution processing.

A liquid metal ion source (LMIS) is very bright and can provide high resolution processing, but is limited to a low beam current at high resolution. A typical system using a gallium LMIS can provide five to seven nanometers of lateral resolution. Such systems are widely used in the characterization and treatment of materials on microscopic to nanoscopic scales. A gallium LMIS comprises a pointed needle coated with a layer of gallium. An electric field is applied to the liquid gallium to extract ions from the source. To produce a very narrow beam for high resolution processing, the current in a beam from an LMIS must be kept relatively low, which means low etch rates and longer processing times. As the beam current is increased beyond a certain point, the resolution rapidly degrades.

Plasma ion sources ionize gas in a plasma chamber and extract ions to form a beam that is focused on a work piece. Plasma ion sources have larger virtual source sizes than LMISs and are much less bright. An ion beam from a plasma source, therefore, cannot be focused to as small of a spot as the beam from an LMIS, although a plasma source can produce significantly more current. Plasma sources, such as a duoplasmatron source described by Coath and Long, "A High-Brightness Duoplasmatron Ion Source Microprobe Secondary Ion Mass Spectroscopy," Rev. Sci. Instruments 66(2), p. 1018 (1995), have been used as ion sources for ion beam systems, particularly for applications in mass spectroscopy and ion implantation. Inductively coupled plasma (ICP) sources have been used more recently with a focusing column to form a focused beam of charged particles, i.e., ions or electrons.

An inductively coupled plasma source is capable of providing charged particles within a narrow energy range, which allows the particles to be focused to a smaller spot than ions from a duoplasmatron source. ICP sources, such as the one described in U.S. Pat. No. 7,241,361, which is assigned to the assignee of the present invention, include a radio frequency (RF) antenna typically wrapped around a ceramic plasma chamber. The RF antenna provides energy to maintain the gas in an ionized state within the chamber. Because the virtual source size of a plasma source is much larger than the virtual source size of an LMIS, the plasma source is much less bright.

Electron beams are used in a scanning electron microscope (SEM) to form images of a work piece. The electrons are typically provided by a tungsten or lanthanum hexaboride thermionic emitter or a field emission gun, such as a Schottky emitter or a cold cathode emitter. Such emitters provide a small virtual source and can be focused to a very small spot. A typical electron emitter used in an SEM may have a reduced brightness of between about $2 \times 10^7$ A/m$^2$·sr·V and $8.2 \times 10^7$ A/m$^2$·sr·V. Electrons can be focused to a smaller spot than ions and cause less damage to the sample.

An electron beam focusing column is significantly different from an ion beam focusing column. For example, electron beam columns typically uses magnetic focusing lenses because of their lower aberration, whereas ion beam columns typically use electrostatic focusing lenses because an excessively large current would be required to focus the heavy ions using a magnetic lens.

An SEM can be used not only to form an image of a work piece, but also to analyze the processed area for chemical or elemental composition. Energy dispersive spectroscopy (EDS) systems are commonly found on SEMs and are useful in performing localized chemical analysis of a sample. EDS systems utilize the x-ray spectrum emitted by a material impacted by high-energy electrons from the focused beam of electrons of the SEM imaging operation. When an electron impacts the sample, the electron loses energy by a variety of mechanisms. One energy loss mechanism includes transferring the electron energy to an inner shell electron, which can be ejected from the atom as a result. An outer shell electron will then fall into the inner shell, and a characteristic x-ray may be emitted. The energy of the characteristic x-ray is determined by the difference in energies between the inner shell and the outer shell. Because the energies of the shells are characteristic of the element, the energy of the x-ray is also characteristic of the material from which it is emitted. When the number of x-rays at different energies is plotted on a graph, one obtains a characteristic spectrum, such as the spectrum of pyrite shown in FIG. 1. The peaks are named for the corresponding original and final shell of the electron that originated the x-ray. FIG. 1 shows the sulfur Kα peak, the iron Kα peak and the iron Kβ peaks.

It is often useful to prepare a sample using a FIB and then use an SEM to image or to perform an EDS analysis. If two separate instruments are used, the user is faced with a lengthy process of removing the sample from the FIB system and then setting up the sample in the EDS capable system which can take upwards of 30 minutes or more. This makes for an unacceptably long time for many applications to be able to analyze a prepared sample.

A known solution to reduce this overhead is a dual-beam system consisting of a FIB column and SEM column on the same platform. Each column is optimized for the type of particle beam that it produces. A dual column system is costly because of the two separate focusing columns. The SEM of a dual beam system, such as the Quanta 3D system from FEI Company, the assignee of the present invention, typically has an imaging resolution of better than five nanometers.

While it is known that a plasma chamber can be used as a source of electrons as well as ions, plasma sources are not typically used for an SEM because the large virtual source size makes for poor resolution compared to other sources. Moreover, when electrons are extracted from a plasma source, negative ions are also extracted. Lastly, because the difference in the configuration of the optical columns for focusing electron and focusing ions, using the same column for both ions and electrons would result in less than optimum resolution for ions, electrons, or both.

SUMMARY OF THE INVENTION

An object of the invention is to provide a method and apparatus for electron dispersive x-ray spectroscopy analysis of a FIB prepared sample using a single optical column having inductively coupled plasma source.

In a preferred embodiment, a single column inductively coupled plasma source system is outfitted with a power supply and configuration scheme capable of operating in at least two user selectable modes, ion-mode for FIB processing and electron-mode for SEM analysis. An attached x-ray detector, spectrometer or other spectrum analyzing system is used to collect the information necessary to determine the physical properties of the sample.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
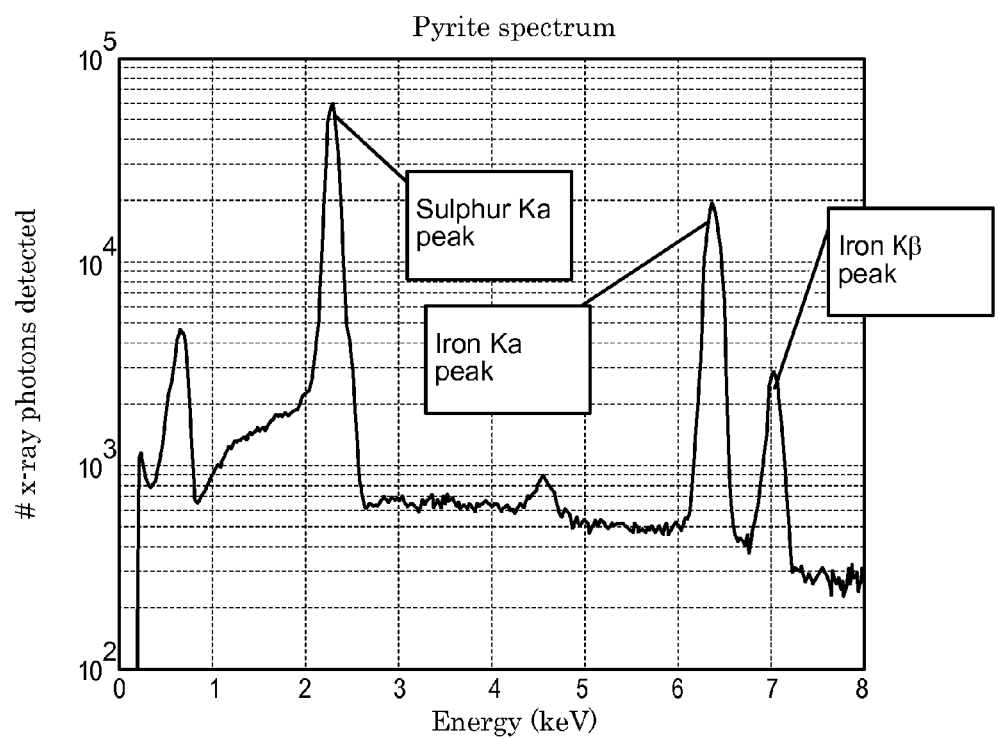
FIG. 1 shows an example x-ray spectrum of pyrite, which includes iron and sulfur.

While it is known that the resolution of an electron beam from a plasma electron source is poorer than the resolution of an electron beam from a thermionic or field emission source, applicants have recognized that beam resolution is not the limiting factor in many applications, such as EDS. In scanning electron microscopy, secondary electrons used to form the image come from a relatively small interaction volume around the impact point of the primary beam. As the beam electrons penetrate beneath the sample surface, they are scattered randomly away from the beam's point of impact. Only secondary electrons generated near the top surface are capable of escaping and being detected, and those secondary electron typically come from close to the point of impact of the primary beam. X-rays, on the other hand, can escape from a much greater depth and so detectable x-rays continue to be generated as the electron moves downwards and is scattered sideways. Thus, the "interaction volume," that is, the region from which signal is detected, is much larger for x-rays, typically about a cubic micron, than for secondary electrons. For x-rays, the interaction volume, not the beam spot size, becomes the critical factor in resolution. Thus, applicants have found that using a relatively low brightness plasma electron source can provide adequate resolution for EDS, particularly in applications, such as natural resources, in which the sample is relatively uniform over a scale of hundreds of nanometers.

A preferred embodiment of the invention uses an ICP source equipped with a high voltage bipolar power supply which is capable of selectable modes of operation and sourcing the appropriate voltages for each mode, enabling the generation of a beam of ions or electrons. The term "bipolar power supply" as used herein refers to a power supply capable of switching or reversing polarities of the supplied voltages. "Power supply," as used herein, means any source of one or more voltages or currents and is not limited to any specific type, form or composition. In an ion mode, the source operates at a high positive potential with respect to ground, and the extractor operates at a high negative voltage with respect to the source voltage. In electron mode, the source operates at a high negative potential with respect to ground and the extractor operates at high positive potential with respect to the source voltage. It is understood that the different properties of ion and electrons, with the electrons being several orders of magnitude lighter than the ions, requires different operating parameters in the plasma source and in the optical elements in the focusing column. The setting will vary with the type of ion and the application. Based on the guidance provided herein, optimum column settings for a specific application can be readily determined through simulation and routine experimentation. An attached x-ray detector, spectrometer or other spectrum analyzer is used to collect the information necessary to determine the physical properties of the sample.

Figure 2:
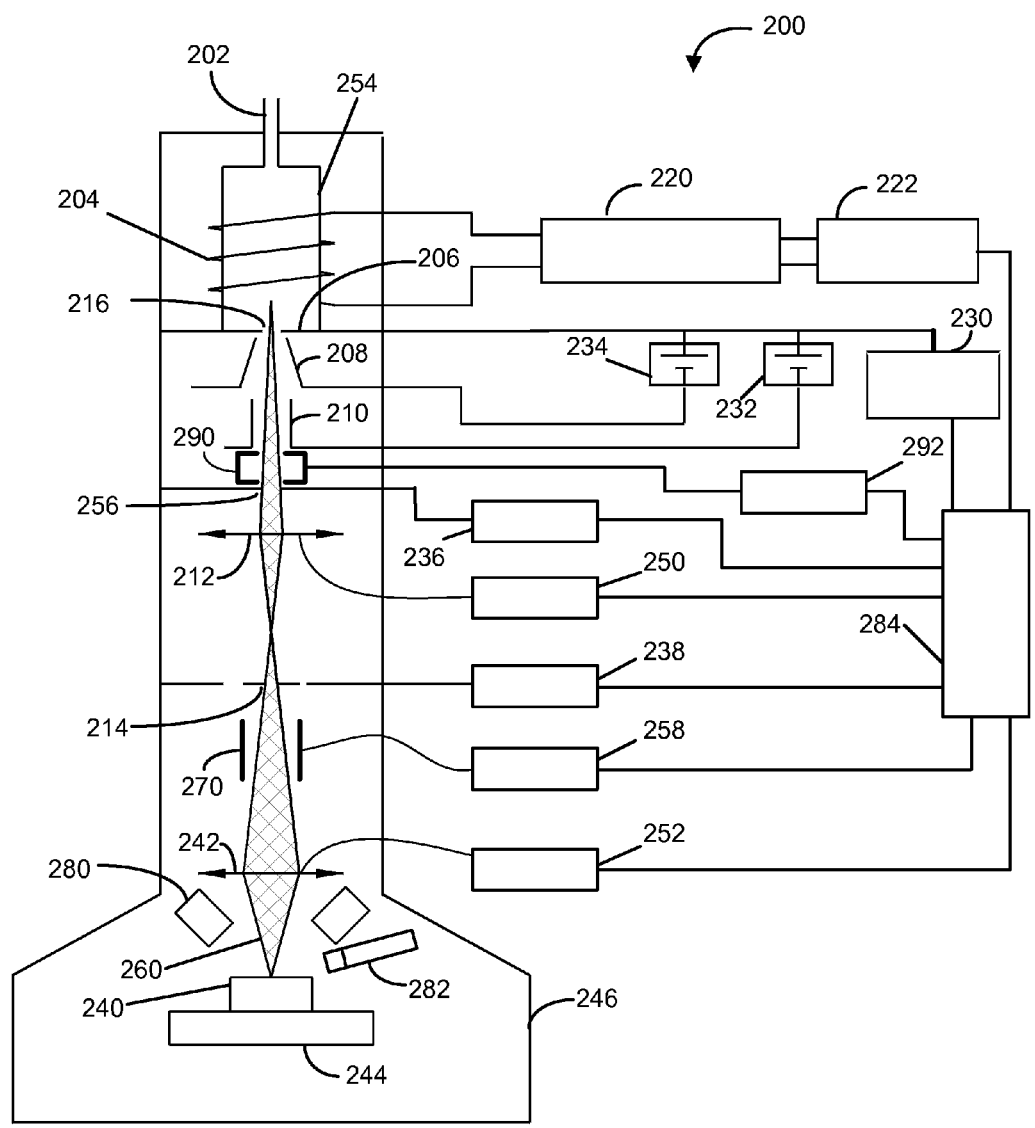
FIG. 2 shows a cross-sectional schematic view of an embodiment of the invention including a portion of an inductively-coupled plasma source with EDS capability.

FIG. 2 is a schematic diagram of a charged particle beam system 200 of the present invention. An RF power supply 222 supplies RF power to a match box 220 which is connected to an antenna 204 which surrounds a source tube 254 within which a plasma is generated. A split Faraday shield (not shown) is preferably positioned between the antenna 204 and the interior of the plasma tube 254 to reduce capacitive coupling, thereby reducing the energy spread of the extracted charged particles, reducing chromatic aberration and allowing the particles to be focused to a smaller spot. RF power supply 222 could also apply power to the antenna in a "balanced" manner, as described in U.S. Pat. No. 7,241,361, to further reduce energy spread of the particles in the extracted beam. A feed gas to be ionized is fed into the source tube 254 through a feed system 202. A biasing power supply 230 is connected to a source biasing electrode 206. The source biasing electrode can be biased to a large negative voltage when an electron beam or beam of negative ions is to be generated or to a high positive voltage when a beam of positive ions is to be generated. For example, the plasma is typically biased to about positive 30 kV when ions are extract for ion beam milling; the plasma is typically biased to between about negative 20 kV and negative 30 kV when electrons extract for EDS analysis, and the plasma is typically biased to between about negative 1 kV and negative 10 kV when electrons extract for forming a scanning electron beam image. Use of an ICP with a split faraday shield and a balanced antenna facilitates the production of a higher resolution beam which is suitable for some application in which a large spot size would not be adequate.

An extractor electrode 208 in the optical column is biased by a power supply 234, referenced to the output voltage of the biasing power supply 230. The power supply 234 is preferably a bipolar power supply so that it can supply either a positive or negative bias to the extractor electrode. When electrons or negative ions are being extracted, a voltage positive to the source biasing electron is used; when positive ions are being extracted, a voltage negative to the source biasing electron is used. Thus, source biasing electron 208 is preferably a bipolar power supply, capable of applying a positive or negative voltage. A condenser electrode 210 in the column is biased by a power supply 232, also referenced to the output voltage of the biasing power supply 230. Condenser electrode power supply 232 is preferably bipolar and can bias condenser electrode 210 to a positive or negative bias depending on the charged of particles extracted from the plasma source.

Ions or electrons are extracted from the plasma contained in the source tube 254 due to the high electric field induced at the lower end of the source tube 254 by the bias voltage on the extractor electrode 208 relative to the voltage on the source biasing electrode 206. The ions or electrons extracted from the source tube 254 emerge downwards through the opening in the source biasing electrode 206, forming a charged particle beam which enters the optical column. A mass filter 290, typically comprising a deflection in the beam path or a chicane, is used to separate electrons from negative ions that are simultaneously extracted. The mass filter 290 is controlled by the mass filter actuator 292. The particles could be deflected, for example, by a magnetic deflection element such as a dipole or a quadrupole or by an E×B mass filter.

Thus, the plasma at the lower end of the source tube 254 serves as a "virtual source" of ions or electrons for the charged particle beam column. In general, a large portion of the charged particle beam going down the optical column strikes one or more apertures in the column, such as apertures 216, 256, or 214, preferably composed of a material that is resistant to erosion by the ion beam. In the FIB column of FIG. 2, three apertures are shown: 1) an aperture 216 in the source biasing electrode 206, 2) a beam acceptance aperture (BAA) 256, and 3) a beam defining aperture (BDA) 214.

The position of the beam acceptance aperture 256 is controlled by the beam acceptance aperture actuator 236. The position and choice of beam defining aperture 214 is controlled by the beam defining aperture actuator 238. Two lenses 212 and 242, preferably electrostatic einzel lenses, are shown forming a focused beam 260 on the surface of a sample 240 supported and moved by a sample stage 244 within a vacuum enclosure 246. Lenses 212 and 242 are preferably bipolar lenses so that they can act as accelerating lens or decelerating lenses for positively charged or negatively charged particles. Lens 212 has a power supply 250, while lens 242 has a power supply 252.

A pair of deflectors 270 position and move the beam across the work piece surface. Deflectors 270 are controlled by a deflector control 258. A pair of x-ray detectors 280, such as solid state silicon drift detectors or Si(Li) detectors collect x-rays to form a spectrum of the work piece. A secondary electron detector 282 collects secondary electrons for forming an image by scanning electron microscopy or scanning ion beam imaging. System 200 optionally includes other components, such as a gas injector for charged particle beam assisted etching and deposition. A controller 284 controls the operation of system 200, and can switch the voltages on the source biasing electrode, on the extractor electrode, and optionally on other components in the system to switch between directing an electron beam toward the work piece or directing an ion beam toward the work piece.

Embodiments of the invention provide a high current, medium resolution electron beam, which is particularly suited, though not limited, to EDS applications Skilled persons will understand that the operating parameters of the plasma source and the focusing column are typically optimized for the type of particles extracted from the plasma source. Table I shows typical operating parameters for operating with xenon ions, positive oxygen ions, and electrons. Skilled persons understand that an einzel lens can be operated as an "acceleration lens" or a "deceleration lens," depending on the voltage on the lens. In some embodiments, it is preferable to operate the first and second lenses as a accelerating lenses when focusing low energy charged particles and as a decelerating lens when focusing high energy charged particles.

| Operating parameter | Xenon ions | Oxygen ions | Electrons |
|---|---|---|---|
| Gas pressure in plasma chamber | .001 mbar to 1.2 mbar | .001 mbar to 1.2 mbar | .001 mbar to 1.2 mbar |
| Plasma bias voltage | +1 kV to +30 kV | +1 kV to +30 kV | −1 kV to −30 kV |
| Extractor electrode voltage (relative to beam voltage) | −2 kV to −15 kV | −2 kV to −15 kV | +2 kV to +15 kV |
| Deflection voltage range | −150 V to +150 V | −150 V to +150 V | −150 V to +150 V |
| First lens voltage | 0 V to +30 kV | 0 V to +30 kV | −30 kV to 0 V |
| Second lens voltage | −15 V to +30 kV | −15 V to +30 kV | −30 kV to +15 V |
| RF Power | 25 W to 1000 W | 25 W to 1000 W | 25 W to 1000 W |
| Gas pressure in specimen chamber | $5 \times 10^{-7}$ mbar to $1 \times 10^{-7}$ mbar | $5 \times 10^{-7}$ mbar to $1 \times 10^{-7}$ mbar | $5 \times 10^{-7}$ mbar to $1 \times 10^{-7}$ mbar |

Fixed design parameters of the column, such as the position and design of the lenses, is typically optimized for ion beams, although the column design can be optimized for an electron beam or can be a compromise between optimizing for ions and electrons. The electron beam is estimated to have a spot size of less than 80 nm at a beam current of 50 pA, less than 200 nm at a beam current of about 1 nA, less than 1 µm at a beam current of 100 nA, and less than 2.3 µm at a beam current of 1 µA. While the spot size is not as small at low beam currents as a convention electron source, considering the interaction volume of one micrometer square for the production of x-rays, the spot size is adequately small for useful EDS analysis, particularly for analyzing sample regions, such as crystal grains, that are typically larger than those spot sizes.

The brightness of the ICP as an electron source is typically about $6 \times 10^4$ A/m$^2$·sr·V.

Figure 3:
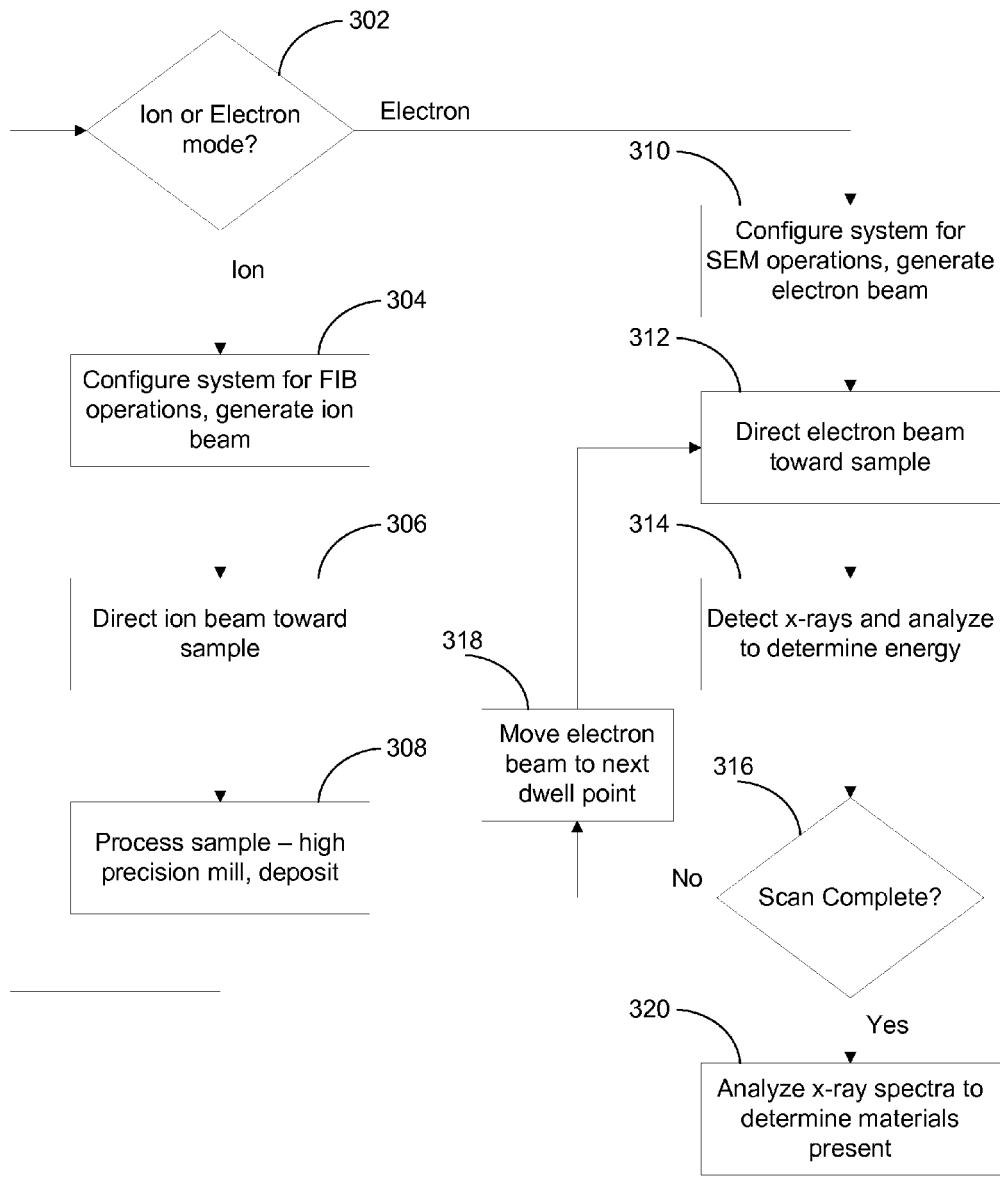
FIG. 3 shows a method of one embodiment of the invention in which a sample is prepared in FIB mode then analyzed in SEM mode with EDS.

FIG. 3 is a flow chart showing a method of one embodiment of the invention in which a sample is prepared in FIB mode then analyzed in SEM mode with EDS. In step 302, the user selects the desired operating mode of the ICP system, ion-mode or electron-mode. For example, if ion-mode is selected, step 304 would follow. In step 304, the appropriate power supplies, gas, and system parameters are setup for FIB operations with the beam voltage source configured with a high positive voltage with respect to ground applied to the source electrode and a high negative voltage with respect to the beam voltage applied to the extractor electrode. With the ion source gas provided and the plasma ignited, an ion beam is generated. Voltages are applied to the focusing lens for focusing the ions. In step 306, the ion beam is directed to the sample for processing. In step 308, the sample is processed by FIB operations which include, for example, imaging, milling, depositing, and analyzing with great precision.

Once the sample is FIB processed or prepared, the user may want to follow-up with SEM imaging and an EDS analysis. In such case, the user simply switches the ICP operating mode to the electron-mode in step 302. In step 310, the appropriate power supplies, gas, and system parameters are then setup for SEM operations with the beam voltage source configured with a high negative voltage with respect to ground applied to the source electrode and a high positive voltage with respect to the beam voltage applied to the extractor electrode. With the electron source gas provided and the plasma ignited, an electron beam is generated. In step 312, the electron beam is directed to the sample. In step 314, x-rays are emitted from the surface in response to the impact of the electrons upon the sample and are detected and the energy measured by an energy dispersive x-ray detector. If it is determined in step 316 that not all points in the sample have been scanned, then the electron beam is moved to the next dwell point in step 318, and additional x-rays are collected at that point. The scan continues until the desired portion of the sample surface is completed, with x-rays being collected at each point. After the scan is complete, the x-rays collected while the beam was positioned at each of the scan points are analyzed in step 320, determining which materials are present.

Figure 4:
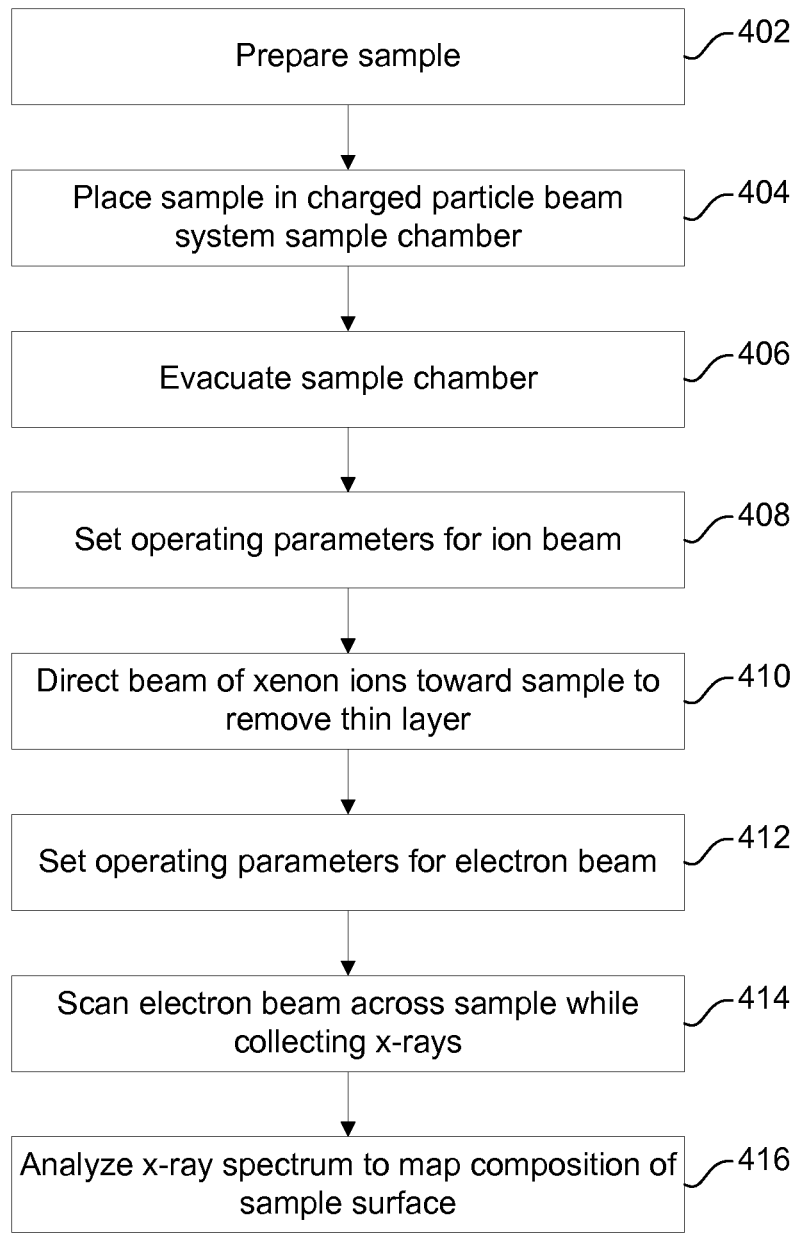
FIG. 4 shows a flowchart of an application using a system like the one in FIG. 2.

FIG. 4 shows an application of a system like the one in FIG. 2. In step 402, a mineral sample is prepared from in an epoxy matrix by known methods. Such samples typically have a 30 mm diameter. In step 404, the sample block is placed in the sample chamber of the charged particle beam system having an ICP charged particle source. In step 406, the sample chamber is evacuated. In step 408, the operating parameters of the plasma source and focusing column are set for an ion beam, such as a beam of xenon ions. In step 410, xenon ions are extracted from the plasma source and directed in a beam toward the sample to remove a small amount of material, such as approximately between 0.1 and 5 microns, from the top surface, depending upon the sample porosity, naturally occurring oxide/nitride thickness, and the grinding method. Because Xenon ions are relatively heavy, they can remove material more rapidly than lighter ions and are less likely to penetrate and remain in the sample. After the top surface of the sample is removed, the operating parameters of the system are adjusted in step 412 for use with an electron beam. In step 414, the electron beam is scanned across the sample, with x-rays are collected at points on the sample. In step 416, the spectrum collected is analyzed to determine a map of the composition of different points on the sample. Removing a material such as a surface layer with the ion beam and then analyzing the exposed material is preferably performed in the same vacuum chamber without exposing the work piece to atmosphere. This provides a clean surface for analysis and prevents the formation of oxides, nitrides, or other compounds that could alter the analysis.

In integrated circuit analysis, the ion beam from the plasma source can be used to remove material more rapidly than a LMIS because of the much larger beam current. This is particularly useful in failure analysis of packaged "flip chip" integrated circuits, whose circuitry is exposed from the back side by the ion beam, requiring a great deal of material to be removed. The electron beam can them be used to obtain an image and perform a spectroscopic examination of an exposed defect.

Some embodiments of the invention provide a single charged particle beam column that is switchable between producing an electron beam and producing an ion beam from a single plasma source. Some embodiments of the invention use the plasma source as a source of electrons for various operations and analytical techniques. While the embodiments described use the electron beam for EDS analysis, the invention is not limited to any specific use of the electron beam. For example, the electron beam could be used for electron beam induced deposition or etching with a suitable precursor gas. The electron beam could be used for Auger Electron Spectroscopy, X-ray photoelectron spectroscopy, or wavelength dispersive x-ray spectroscopy. While the embodiments described above uses an ICP electron source, the invention is not limited to any particular type of plasma electron source and other types of plasma sources, such as a duoplasmatron plasma source, may be useable in some embodiments.

In accordance with one aspect of some embodiments of the invention, a charged particle beam system comprises a plasma chamber for maintaining a plasma; a biasing electrode for biasing the plasma to an operating voltage; a power source capable of providing a positive or negative voltage to the biasing electrode, wherein the power source is capable of switching polarity to selectively extract positively or negatively charged particles from the plasma chamber; an extractor electrode for extracting charged particles from the plasma source; an extractor electrode power source capable of providing a positive or negative voltage to the extractor electrode; and a focusing column for focusing the charged particles extracted from the plasma source onto a work piece, wherein the focusing column focuses the positive or negatively charged particles onto the work piece.

In accordance with another aspect of some embodiments of the invention, the charged particle beam system further comprises an x-ray detector for detecting x-rays generated by the impact of electrons extracted from the plasma chamber and focused onto the work piece by the focusing column.

In accordance with another aspect of some embodiments of the invention the plasma chamber is part of an inductively coupled plasma source.

In accordance with another aspect of some embodiments of the invention, an apparatus for processing and determining properties of a sample comprises an inductively coupled plasma source which selectively operates in a first mode as an ion source and a second mode as an electron source; a power supply configured to selectively provide a first voltage configuration corresponding to the first mode, allowing focused ion beam operations and at least a second voltage configuration corresponding to at least a second mode, allowing SEM operations; and an x-ray detector to collect information necessary to determine a property of a sample.

In accordance with another aspect of some embodiments of the invention, the detector is an energy dispersive x-ray detector.

In accordance with another aspect of some embodiments of the invention, the energy dispersive x-ray detector is of the silicon drift detector type.

In accordance with another aspect of some embodiments of the invention, the property of a sample comprises chemical or elemental composition of the sample.

In accordance with another aspect of some embodiments of the invention, the first voltage configuration is comprised of a high positive voltage with respect to ground applied to a source electrode and a high negative voltage with respect to the source electrode voltage applied to an extractor electrode; and the second voltage configuration is comprised of a high negative voltage with respect to ground applied to the source electrode and a high positive voltage with respect to the source electrode voltage applied to the extractor electrode.

In accordance with another aspect of some embodiments of the invention, a method for processing a sample, comprises providing a single column inductively coupled plasma source having user selectable modes of operation such that an ion beam is generated in a first mode and an electron beam is generated in at least a second mode; selecting a mode of operation of the inductively coupled plasma source; directing the generated beam toward a sample; and processing the sample with the generated beam.

In accordance with another aspect of some embodiments of the invention directing the generated beam toward a sample comprises directing a beam having a spot size of less than 200 nm toward the sample.

In accordance with another aspect of some embodiments of the invention, directing the generated beam toward a sample comprises directing the ion beam toward the sample in the first mode and directing the electron beam toward the sample in the second mode.

In accordance with another aspect of some embodiments of the invention, processing the sample with the generated beam comprises processing the sample with the ion beam to perform a focused ion beam operation and scanning the sample with the electron beam while collecting emitted x-rays to determining properties of the sample.

In accordance with another aspect of some embodiments of the invention, processing the sample with the ion beam to perform a focused ion beam operation includes exposing material for analysis by the electron beam.

In accordance with another aspect of some embodiments of the invention, exposing material for analysis by the electron beam includes removing a layer of material from the sample surface.

In accordance with another aspect of some embodiments of the invention, a method of processing a sample comprises inductively coupling radio frequency energy from an antenna into a plasma chamber through a split Faraday shield to provide a plasma in the plasma chamber; extracting electrons from the plasma in the plasma chamber; and forming the electrons into a focused beam and directing the beam toward the sample.

In accordance with another aspect of some embodiments of the invention, the focused beam of electrons has a spot size at the sample of less than 200 nm with an electron current of 1 nA or greater.

In accordance with another aspect of some embodiments of the invention, the focused beam of electrons has a spot size at the sample of less than 2.3 $\mu$m with an electron current of 1 $\mu$A or greater.

In accordance with another aspect of some embodiments of the invention, the method further includes detecting emissions from the points impacted by electrons during a scan; and determining properties of the sample from the emissions collected.

In accordance with another aspect of some embodiments of the invention, the emissions are x-rays.

In accordance with another aspect of some embodiments of the invention, the emissions are secondary electrons or backscattered electrons.

In accordance with another aspect of some embodiments of the invention, the method further comprises extracting ions from the plasma chamber; and forming the ions into a focused beam and directing the beam toward the sample.

In accordance with another aspect of some embodiments of the invention, forming the ions into a focused beam and directing the beam toward the sample includes removing material from the sample surface to expose underlying material; and forming the electrons into a focused beam and directing the beam toward the sample includes directing the beam toward the exposed underlying material, without removing the sample from the vacuum chamber.

In accordance with another aspect of some embodiments of the invention, extracting ions from the plasma chamber includes extracting argon, xenon, or oxygen ions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
    a charged particle source for selectively providing positively or negatively charged particles;
    a biasing electrode for biasing the charged particle source to an operating voltage;
    a power source capable of providing a positive or negative voltage to the biasing electrode, wherein the power source is capable of switching polarity to selectively extract positively or negatively charged particles from the charged particle source;

an extractor electrode for extracting charged particles from the charged particle source;

an extractor electrode power source capable of providing a positive or negative voltage to the extractor electrode; and a focusing column for focusing the charged particles extracted from the charged particle source onto a work piece, wherein the focusing column is a single column and focuses the positively or negatively charged particles onto the work piece.

2. The charged particle beam system of claim 1 further comprising an x-ray detector for detecting x-rays generated by the impact of electrons extracted from the charged particle source and focused onto the work piece by the focusing column.

3. An apparatus for processing and determining properties of a sample, comprising:

an charged particle source which selectively operates in a first mode as an ion source and a second mode as an electron source;

a power supply configured to selectively provide a first voltage configuration corresponding to the first mode, allowing focused ion beam operations and at least a second voltage configuration corresponding to at least a second mode, allowing SEM operations, the focused ion beam operations and SEM operations both using the same focusing column; and an x-ray detector to collect information necessary to determine a property of a sample.

4. The apparatus of claim 3 in which the detector is an energy dispersive x-ray detector.

5. The apparatus of claim 3 in which the property of a sample comprises chemical or elemental composition of the sample.

6. The apparatus of claim 3 in which the first voltage configuration is comprised of a high positive voltage with respect to ground applied to a source electrode and a high negative voltage with respect to the source electrode voltage applied to an extractor electrode; and the second voltage configuration is comprised of a high negative voltage with respect to ground applied to the source electrode and a high positive voltage with respect to the source electrode voltage applied to the extractor electrode.

7. A method for processing a sample, comprising:

providing a single focusing column with an charged particle source having user selectable modes of operation such that an ion beam is generated in a first mode and an electron beam is generated in at least a second mode;

selecting a mode of operation of the charged particle source;

directing the generated beam toward a sample through the single focusing column; and processing the sample with the generated beam.

8. The method of claim 7 in which directing the generated beam toward a sample comprises directing a beam having a spot size of less than 200 nm toward the sample.

9. The method of claim 7 in which directing the generated beam toward a sample comprises directing the ion beam toward the sample in the first mode and directing the electron beam toward the sample in the second mode.

10. The method of claim 7 in which processing the sample with the generated beam comprises processing the sample with the ion beam to perform a focused ion beam operation and scanning the sample with the electron beam while collecting emitted x-rays to determining properties of the sample.

11. The method of claim 10 in which processing the sample with the ion beam to perform a focused ion beam operation includes exposing material for analysis by the electron beam.

12. The method of claim 11 in which exposing material for analysis by the electron beam includes removing a layer of material from the sample surface.

13. The method of claim 7 in which the generated beam in the second mode comprises a beam of electrons, the beam having a spot size at the sample of less than 200 nm with an electron current of 1 nA or greater.

14. The method of claim 7 in which the generated beam in the second mode comprises a beam of electrons, the beam having a spot size at the sample of less than 2.3 µm with an electron current of 1 µA or greater.

15. The method of claim 7 further comprising:

detecting emissions from the points impacted by electrons during a scan; and determining properties of the sample from the emissions collected.

16. The method of claim 15 in which the emissions are x-rays.

17. The method of claim 15 in which the emissions are secondary electrons or backscattered electrons.

18. The method of claim 7 in which:

the generated beam in the second mode comprises ions from the charged particle source; and directing the generated beam toward the sample comprises forming the ions into a focused beam and directing the beam toward the sample.

19. The method of claim 18 in which:

forming the ions into a focused beam and directing the focused beam toward the sample includes removing material from the sample surface to expose underlying material; and and further comprising selecting the second mode of operation and directing the generated beam of electrons toward the the exposed underlying material, without removing the sample from the vacuum chamber.

20. The method of claim 18 in which the ions from the charged particle source include argon, xenon, or oxygen ions.

* * * * *